United States Patent [19]

Moraw et al.

[11] 4,294,913

[45] Oct. 13, 1981

[54] INFORMATION CARRIERS, METHOD OF FORMING AND COPYING SAID CARRIERS

[75] Inventors: Roland Moraw; Renate Schädlich, both of Naurod, Fed. Rep. of Germany

[73] Assignee: Hoechst Aktiengesellschaft, Frankfurt am Main, Fed. Rep. of Germany

[21] Appl. No.: 64,645

[22] Filed: Aug. 7, 1979

Related U.S. Application Data

[62] Division of Ser. No. 861,491, Dec. 16, 1977.

[30] Foreign Application Priority Data

Dec. 17, 1976 [DE] Fed. Rep. of Germany ....... 2657246

[51] Int. Cl.³ .............................................. G03C 7/00
[52] U.S. Cl. .................................... 430/396; 430/326; 430/327; 430/356; 430/363; 430/365; 430/945; 430/952
[58] Field of Search ............... 430/356, 363, 945, 952, 430/365, 2, 325, 326, 396, 327

[56] References Cited

U.S. PATENT DOCUMENTS

| | | | |
|---|---|---|---|
| 3,663,221 | 5/1972 | Higgins et al. | 430/356 |
| 3,723,120 | 3/1973 | Hummel | 430/396 |
| 4,017,158 | 4/1977 | Booth | 430/2 |
| 4,019,817 | 4/1977 | Matsumoto | 430/396 |
| 4,082,453 | 4/1978 | Knop | 430/952 |
| 4,150,398 | 4/1979 | Kojima et al. | 430/945 |

FOREIGN PATENT DOCUMENTS

| | | |
|---|---|---|
| 140907 | 5/1903 | Fed. Rep. of Germany . |
| 2703160 | 7/1977 | Fed. Rep. of Germany . |
| 2657246 | 2/1978 | Fed. Rep. of Germany . |
| 2299661 | 8/1976 | France . |
| 2338503 | 8/1977 | France . |
| 7700486 | 1/1977 | Netherlands . |
| 11466 | of 1900 | United Kingdom . |
| 6825 | of 1906 | United Kingdom . |

OTHER PUBLICATIONS

Gale et al., SMPTE Journal, vol. 87, No. 1, pp. 12-13, Jan. 1978.
Gale, Optics Communication, vol. 18, No. 3, pp. 292-297, Aug. 1976.
Austin et al., Applied Optics, vol. 15, No. 4, pp. 1071-1074, Apr. 1976.
Friedman, "History of Color Photography", pp. 23-33, The Focal Press, London, 2nd Ed., 1968.
Wall, "History of Three-Color Photography", pp. 674-681, American Photographic Publ. Co., New York, 1925.
Knop, Optics Communications, vol. 18, No. 3, pp. 298-303, Aug. 1976.
Gak et al., Naturwissenschaften, vol. 63, No. 4, pp. 180-184, Apr. 1976.

*Primary Examiner*—J. Travis Brown
*Attorney, Agent, or Firm*—Schwartz, Jeffery, Schwaab, Mack, Blumenthal & Koch

[57] ABSTRACT

An original information carrier is disclosed which comprises a recording layer applied to a carrier material. The recording layer contains information in the form of a relief image which is made of relief part-images which border on one another without overlapping. The recording layer further comprises a relief grating of different grating depths superimposed over the areas of said relief part-images.

A process for producing an information carrier is disclosed which comprises exposing a recording layer through separate color separation originals, exposing the layer to a grating pattern, and developing the exposed recording layer.

A process for forming a matrix containing the information stored on an information carrier is disclosed which comprises forming a layer of material on the original information carrier and then separating the layer from the carrier. The separated layer of material may then be used to make additional copies of the original relief image by contacting it with transparent deformable materials.

Also, an information carrier which is a copy of an original information carrier is disclosed which is made of a deformable material having the relief gratings and part-images of the original embossed therein.

15 Claims, 8 Drawing Figures

INFORMATION CARRIERS, METHOD OF FORMING AND COPYING SAID CARRIERS

This is a division of application Ser. No. 861,491, filed Dec. 16, 1977.

BACKGROUND OF THE INVENTION

1. Field of the Invention

The invention relates to an information carrier and processes for producing an original copy of the carrier, which comprises a recording layer deposited on a carrier material. A relief image containing the information is embossed in the recording layer.

2. Description of the Prior Art

Images with grating-like screening have been produced by the ZOD (zero order diffraction) technique described in the LASER u. Elektro-Optik Journal No. 3/1976, pages 16–17. Three nickel matrices are produced from the relief images which correspond, for example, to three primary-color grating patterns in a photoresist, and colorless thermoplastic films of, for example, polyvinyl chloride are embossed with these matrices. These films are mechanically superimposed, and, on projection with conventional projectors, colored projection images are obtained from the colorless relief images. The grating-shaped screening is effected with relief gratings of rectangular cross-section, the grating periods being approximately 1.5 $\mu$m. A separate nickel matrix with different relief depths is made for each color separation (red, yellow and blue), from which separate embossed images are produced. The relief depths differ depending on the color separation. The greatest relief depths are used for the red color separation while the smallest are used for the blue color separation. The color separation images are screened. The embossed images are then superimposed to form a three-layered relief image which can be used to project colored images. The technique described yields very bright color images with high resolution. The relief images can be duplicated relatively cheaply and rapidly by an embossing process.

A disadvantage, which has hindered the introduction of this technique, is the expansive production process, incurred by performing three completely separate operations for producing the individual, embossed relief images, corresponding to the color separations. A further disadvantage ensues from the necessity of aligning the three separate relief images to form the duplicate image required for the colored projection.

SUMMARY OF THE INVENTION

It is an object of the invention to provide an original or initial information carrier which overcomes the above deficiencies of the prior art.

It is a further object of the invention to provide a process of making the improved information carrier of the invention.

It is yet another object of the invention to disclose a matrix which may be used to reproduce the information stored on the initial or original information carrier.

It is yet another object of the invention to provide a process for forming and using the matrix to emboss the original information onto a deformable transparent material to form duplicate copies of the original.

In accordance with the invention, an information carrier has been developed which comprises a recording layer applied to a carrier material. The recording layer contains information embossed therein in the form of a relief image. The relief image comprises relief part-images which border on each other without overlapping. The recording layer further comprises a relief grating having different grating depths superimposed on the areas of said relief part-images.

The process for producing an original copy of an information carrier comprises exposing a recording layer mounted on a carrier through separate color separation originals to form relief part-images. The original is transparent in the areas of the particular projection colors of the color separation originals. The recording is also exposed to a grating pattern separately from the other exposure to form relief part-images. The doubly exposed recording layer is then developed.

The invention also makes it possible to reproduce the information stored on an information carrier. In such a process, a recording layer, having information therein in the form of a relief image and comprising a relief grating having different grating depths, is coated with a thin electrically conductive layer which is electroplated onto it. A metal layer is then deposited on the electrically conductive layer so that the metal coating layer represents the negative relief image of the recording layer. The metal coating or matrix is then separated from the recording layer.

Furthermore, as information carrier is disclosed which comprises an embossable layer having information embossed therein in the form of a relief image. The relief image is composed of relief part-images which border but do not overlap each other. The layer further comprises a relief grating superimposed over the areas covered by the individual relief part-images.

Finally, the invention includes a process of embossing a deformable transparent material by applying the matrix of the invention to a deformable transparent material to produce a relief image on the transparent material. After the relief image is formed, the matrix layer is separated from the deformable material.

An important feature of the invention is that the relief image is composed from the superposition of the relief part-images corresponding to the individual color separations, in such a way that areas of different colors, which when using screened images may also be screen points, at the most touch, but do not overlap one another.

DESCRIPTION OF THE PREFERRED EMBODIMENTS

Figure 1A:
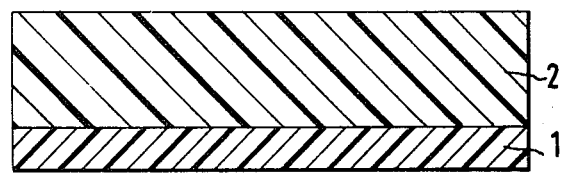
FIGS. 1a, b, c, and d show an original copy of an information carrier in cross-section, in the various process stages of production.

Experiments may be run to investigate the properties of photoresist layers having thicknesses varying between 0.95 and 2.10 microns on transparent films. Four samples are selected in which the photoresist layers have thicknesses of 0.95 microns, 1.34 microns, 1.72 microns and 2.10 microns. The thicknesses of the layers can be determined by means of an interference microscope on flaked-off portions of the layers. The sample layers are brought into contact with an original grating and are irradiated through the grating with actinic light. Parallel light from a 200 watt mercury high-pressure lamp may, for example, be used. The light passes through a quartz lens having a focal length of 15 cm. and then through a blue glass filter having a maximum transmission of 75% of the light intensity at a wavelength of 400 nm. The grating original is, for example, a glass plate with transparent areas and areas made opaque by being covered with metal strips. The period of the grating is 138 lines/mm. After various exposure times the samples, which are developed with aqueous alkaline developer, are irradiated with white xenon light. Bright, colored diffraction images appear. The transmitted undiffracted light exhibits the following colors:

| Exposure time (seconds) | Thickness of the photoresist layer | | | |
|---|---|---|---|---|
| | 0.95 μm | 1.34 μm | 1.72 μm | 2.10 μm |
| 0 | pale-yellow/brown | | (intrinsic color of the photoresist) | |
| 20 | yellowish | yellowish | yellowish | yellowish |
| 30 | blue | blue | blue | blue |
| 40 | light green | intense yellow | intense yellow | intense yellow |
| 50 | light green | pale magenta | intense magenta | intense magenta |
| 60 | light green | pale magenta | pale magenta | intense cyan |
| 70 | light green with bluish patches | pale magenta with yellow patches | pale magenta | light green |

Intense projection colors are thus seen to occur with the following relief depths:

| yellow: | between 0.95 μm and 1.34 μm |
| magenta: | between 1.34 μm and 1.72 μm |
| cyan: | between 1.72 μm and 2.10 μm |

If, for example, a dark blue tending towards violet, and having a wavelength $\lambda_B$ of 410 nm, is to be reproduced, it is necessary that the relief depth of the recording layer be about three times the value of the wavelength of the complementary color, namely yellow, a wavelength $\lambda_Y$ of 580 nm, that is to say, $3\lambda_Y = 1740$ nm $= 1.74$ μm.

The threefold values of the wavelengths of light of the particular complementary colors lie within the specified relief intervals. These threefold values for yellow/magenta/cyan amount to approximately 1.26 μm, 1.59 μm and 1.83 μm.

The production of the relief part-images with grating-like screening, in the photoresist layer, and in particular the exposure of the photoresist layer, are essential steps in the process of the invention. The subsequent production of a metal matrix and the embossing of the thermoplastic film are effected by known techniques.

For the reproduction of the cyan color, the photoresist layer provided must be at least about 1.83 μm thick, preferably between 2 μm and 3 μm. The essential factor in this process is the uniformity of the layer thickness. For small areas up to about 1 dm² a homogeneous coating is obtained by dipping and slowly withdrawing the carrier of the photoresist layer out of the coating solution. Alternatively, the coating solution can be applied on a rotating carrier material. The edge regions frequently exhibit a ridge of photoresist and are therefore not used. Variations in the layer thickness can, with careful coating, be kept to below 0.1 μm. Glass plates are preferred for use as carriers for the photoresist layer because of their planar surface and the relatively simple manner in which they may be cleaned before coating. Nevertheless, films and metal carriers may also be used.

A line-by-line exposure technique can be employed in which, for example, a laser beam with a line spacing corresponding to the grating structure is passed over the photoresist layer with image-wise modulation of the intensity. Alternatively, an exposure technique using color separations of the information to be reproduced in color can be employed.

By way of example, in the process utilizing color separations, the exposure of the photoresist layer, with the image information, and the grating exposure are carried out separately at different times. In this process first the image-wise exposure is carried out and then the grating exposure. Although this sequence is preferred, it is not absolutely necessary.

EXAMPLE 1

Figure 1B:
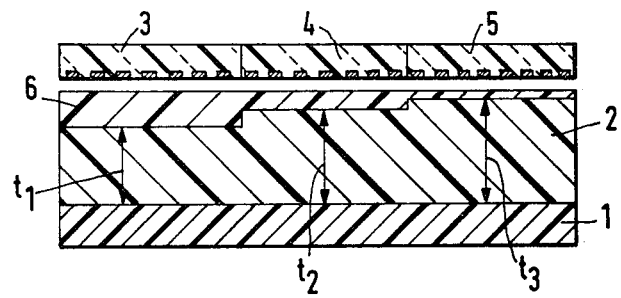

FIG. 1a shows a still unexposed photoresist layer 2 on a carrier layer 1 of glass, film or metal (not drawn to scale). This is exposed through the color separation originals 3, 4 and 5 in such a manner that the image areas of unexposed photoresist which remain have a thickness of about $t_1 = 1.26$ μm under the color-separation original 3 for a yellow projection color; a thickness of about $t_2 = 1.59$ μm under the color-separation original 4 for a magenta-colored projection color; and a thickness $t_3$ of about 1.83 μm under the color-separation original 5 for a cyan projection color, as indicated in FIG. 1b. Separate color-separation originals can be used, in which case the individual color-separation originals must be glass-clear in the area of the particular projection color desired, and must cover in the remaining areas. The particular thickness of the still unexposed photoresist layer is measured very carefully during the exposure in order to end the exposure as soon as the desired residual thickness of photoresist is reached. The determination of the change in optical density in the spectral range of absorption of the light-sensitive compound in the photoresist is a rapid, and to a great extent inertialess, method of measurement. For example, o-quinone-diazides, which are often contained in so-called positive working photoresists, have an absorption maximum at a wavelength of 407 nm. An optical density of 0.824 has been measured on an approximately 3 μm thick photoresist layer and an optical density of 0.072 has been measured on the exposed photoresist layer. The final value represents the optical density of the photolysis product formed during the exposure and is taken into account to correct the optical density of the thickness of the unexposed photoresist layer. This example shows that the measurement of the optical density with a technically possible accuracy of 0.01, and better, permits measurement of the thickness of the unexposed photoresist layer with an accuracy of 0.1 μm and higher. The optical measurement for checking the thickness of the unexposed photoresist layer provides a relevant indication of the thickness of the photoresist which has not as yet been altered photochemically, since in the photoresist layers, which in the photographic sense are of very high contrast, the particular surface layer of non-decomposed o-quinone-diazide facing the light source is converted photochemically and is dissolved away on development.

Figure 3:
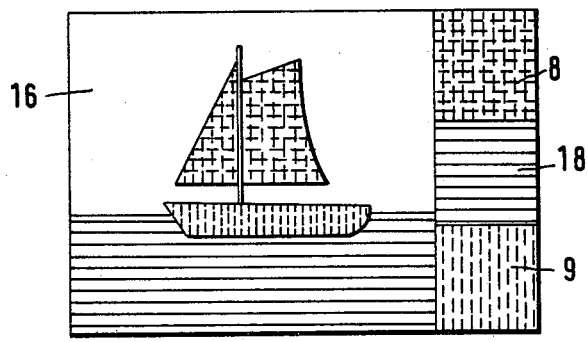
FIG. 3 shows a planar view of an original copy with test areas.

It is advantageous, with respect to the optical check on the thickness during the exposure, to provide test areas 8, 9 and 18 on the photoresist layer 2, as represented in FIG. 3, adjacent to the actual relief image 10, for the exposures corresponding to the various color separation originals 3, 4 and 5.

The intensity distribution of the irradiated actinic light must be constant over the recording area, with variations being, to the extent possible, below one percent. It may, moreover, be necessary to provide empirical corrections for the settings of the optical densities, for example, in order to match the activity of the developer.

The exposures through the color-separation originals are carried out by known techniques, for example. For this purpose, aids such as mechanical guides or microscopic control of the coincidence of marks on the photoresist layer 2 and the color separation original, are required for aligning the color separations, particularly when the latter are screened. With mixed colors, the screen points of the various color separations must not overlap. High resolution, UV-corrected objectives for the exposure of photoresist layers or semiconductor substrates are known. With such objectives, the color-separated exposure can be effected in projection, with change of scale, if required.

The values of the layer thicknesses of the undecomposed resist for the different colors can be taken into consideration in the production of the color-separation originals by matching the optical densities of the color-separation originals, combined on a single photographic film, in such a manner that, with a given thickness of the photoresist layer, the thicknesses of undecomposed photoresist in the layer, corresponding to the projection colors, are obtained during a single exposure.

Figure 1C:
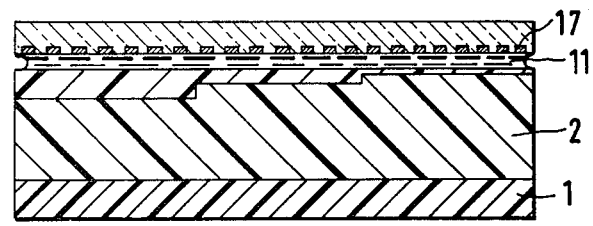
Figure 1D:
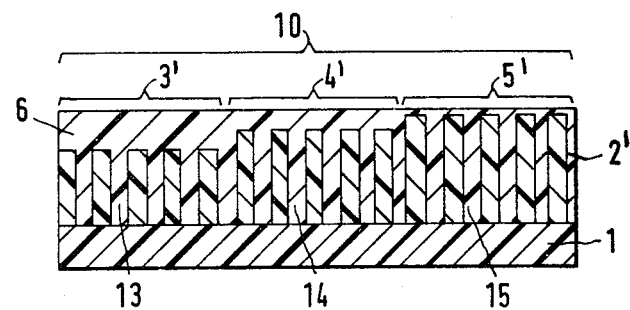

In general, the grating exposure is effected after the image-wise color-separation exposure, without intervening development and this leads to a structure according to FIG. 1d in which the photoresist layer 2 is exposed through to the carrier layer 1, and various grating depths 13, 14 and 15 are obtained after development. The relief image 10 is composed of the relief part-images 3', 4' and 5', which border on one another without overlapping. The exposure can be carried out advantageously with interfering UV laser beams which cross one another. In this way, grating periods of 1/500 mm, and smaller can be produced without difficulty. The desired rectangular grating structure is formed, to a good approximation, by the high-contrast photoresist. In the case of smaller periods, the grating structure can be impressed by the formation of periodic grating-pattern originals using high-resolution, UV-corrected objectives. Contact exposures under very accurate gratings 17, for example metal gratings on glass plates, which are available commercially for periods of 1/10 mm to 1/1000 mm, have also proven useful. As with all contact exposures it is advantageous to introduce a contact liquid 11, for example water of low surface tension, between the photoresist layer 2 and the original, as represented in FIG. 1c. With photographic originals it is appropriate to harden the gelatine layer beforehand and to choose a layer carrier of glass or polyester. For projections with conventional projectors, having separate ratios of, for example, f 1/2.8, grating period of less than 1/500 mm are chosen, to the extent possible. Regardless of the exposure technique used in an individual case, the grating exposure in the method does not give rise to problems, since the whole grating image is produced on the photoresist layer in one operation, and therefore, the exposure time must only be set approximately so that the photolysis advances up to the layer carrier.

During development, the exposed portion 6 of the photo layer 2 is dissolved away. A thin conductive layer having a thickness of about 0.1 microns is applied to the structured residual photoresist layer, for example by chemical deposition of palladium from a solution of palladium chloride or by vapor-deposition of a metal such as silver. A minimum thickness of 50 $\mu$m of a metal, such as nickel, is electroplated onto this layer and hence an embossed matrix is obtained for the information carrier, which is then separate from the photoresist layer after electroplating and forms an original negative of the structured photoresist layer 2'.

A thermoplastic film, preferably of polyvinyl chloride may be embossed with this nickel matrix at an elevated temperature of about 130° C. and under a pressure of several atmospheres/cm$^2$. The embossed film is a duplicate of the structured photoresist layer 2'. Since organic substances, such as polyvinyl chloride and photoresist, have almost identical refractive indices n of about 1.5, the projection colors in both cases are likewise almost identical. If the refractive indices differ significantly from each other, the relief depths can be corrected in order to match the projection colors with each other. The result is a duplicate, which combines all the color separation images, and is embossed in a single operation.

The method produces good results if the thickness of the applied photoresist layers are very constant and if the single exposure through to the given thickness of non-decomposed photoresist is carried out very carefully. However, in practice it is found that the condition of constant thickness can only be met with difficulty.

Figure 2A:
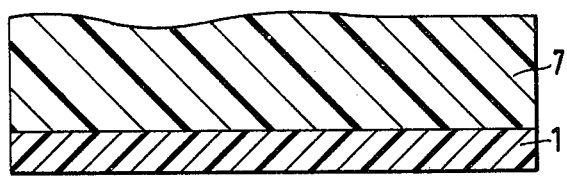
FIGS. 2a and b show another embodiment of an original copy of an information carrier in cross-section at the beginning and at the end of production.

In an alternative process, slight variations in thickness pose less of a problem. In such a process, the exposure is effected in this case again by color separation, but the actinic light is screened, in the form of a grating, at the beginning. The starting point is, similarly, a still unexposed photoresist layer 7 on a carrier 1, as represented in FIG. 2a. The thickness of the layer can have small variations, as indicated in FIG. 2a. The photoresist layer 7 is exposed through the color-separation originals 3, 4 and 5 with actinic light having a grating-like intensity distribution. This exposure is checked continuously by measuring, so that the exposure can be interrupted at exposure depths of about 1.26 $\mu$m at 13, 1.59 $\mu$m at 14 and 1.83 $\mu$m at 15. The result is a relief image 10' with a structured photoresist layer 7', illustrated in FIG. 2b. As was explained in the description of the first process, it is possible to work with separate color separations or with a combined color separation, the transmission values of which have approximately the same relationships as the grating and relief depths in the various color separation areas. The exposures are carried out in a contact arrangement using a contact liquid 11, or by projection with optical elements. Interfering laser light is preferred but an adequate grating-like intensity modulation is also produced by color separation originals with grating lines copied in, or with gratings in the path of the beam of actinic light. The result is a relief image in the photoresist and, after the embossing, an information carrier which combines all the color separation images.

Single-color images will prove adequate for many reproductions. The white parts correspond to grating-free areas of the image, that is to say, areas without grating structures. An additional black color separation must be made for the black parts. The exposure through the black color separation must be effected in such a way that the black areas of the image appear as dark and colorless as possible when projected. With grating-type exposure, therefore, the duration of the exposure time must be so chosen that it does not produce strong projection colors. The resulting relief depths are about 1 μm. The black effect is strengthened by a second, crosswise irradiated grating. The projection color usually varies between dark brown and dark lilac, with transmission values which when averaged over the visible spectral range, can fall to values down to about five percent of the intensity of the full light radiated in. Of course, complete color images also contain black and white parts.

EXAMPLE 2

Figure 4:
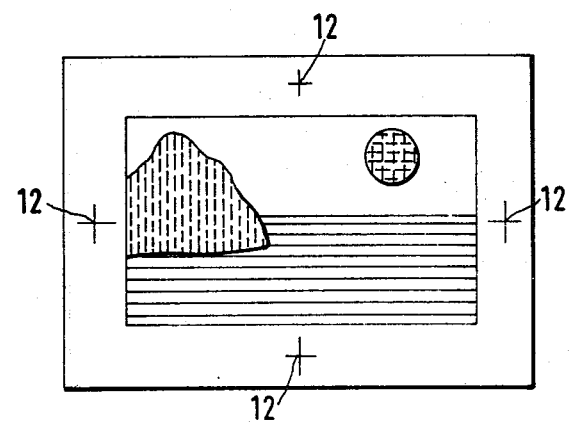
FIG. 4 shows a planar view of an original copy having register marks for alignment.

A layer of positively-working photoresist having a thickness of approximately 3 μm is applied to a 5 cm×5 cm×0.2 cm large glass plate by whirler-coating and drying. Successive exposures are then made for 35 seconds, 25 seconds and 19 seconds through different color separations which are transparent at the areas of the image which are yellow, magenta-colored and cyan, respectively. After removal of the color separations, an exposure is made for 40 seconds under a metal grating, with 138 lines/mm, which is mounted on a glass plate. A drop of water of low surface tension is introduced into the contact gap between the metal grating and the photoresist to avoid interference effects. The exposure is carried out in a contact arrangement as has been already described above. The recording material is arranged in a copying frame, with the photoresist layer facing the layer of the color separation originals, for the exposure under the color separation originals. A register mark in the shape of a pair of straight lines at right-angles is, for example scribed in the recording layer outside the image area for use during alignment. The alignment of the individual color separation originals with respect to the recording layer is effected under a microscope under yellow safelight with the aid of the register marks 12 on the originals (see FIG. 4). These marks are also included in the photographic production of the color separations. The color separation originals contain relatively offset transparent areas of 5 mm diameter for measuring purposes adjacent to the image area. These areas are likewise irradiated with actinic light. In preliminary experiments it has been found that the light intensity behind the measuring areas must be increased by a factor of about 2.75 for yellow, by a factor of about 2.30 for magenta and by a factor of about 1.95 for cyan, in order to obtain the required relief depths This corresponds to exposure times of 35 seconds, 25 seconds and 19 seconds, respectively. The exposed original copy is rinsed with water and drops adhering to it are removed by dabbing it dry. Development is carried out with an aqueous alkaline developer. Following this, a thin copper layer is vapor-deposited on the relief image and a deposit of nickel is electroplated on the copper. A polyvinyl chloride film is embossed in a press at about 130° C. with the nickel matrix obtained. The relief image formed in the polyvinyl chloride film by a single embossing produces a colored image in yellow, magenta and cyan on projection with an undiffracted beam.

EXAMPLE 3

Example 2 is repeated using four color separation originals, the fourth color separation original corresponding to the black image areas in the colored original copy. Glass-clear, transparent areas 16 (see FIG. 3) are associated, at the appropriate positions, with the white image areas in all the color separations. The exposure under the black color separation is effected at up to a 3.1-fold increase of intensity behind the relevant measuring area, for a period of 43 seconds.

In an undiffracted beam path, a projection image with yellow, magenta, cyan, white and black image areas is obtained from the finished relief image produced in one embossing operation. Careful examination has shown that the black image areas rather correspond to a dark brown.

EXAMPLE 4

A 3 μm thick layer of positive-working photoresist is applied to a 50 μm thick glass-clear polyester film by whirler-coating and drying. The photoresist layer is exposed successively through different color separation originals for 67 seconds, 85 seconds and 95 seconds. One of the color separation originals is transparent to yellow, another to magenta and a third to cyan positions on the image, and they are each provided with a grating structure. The exposure is effected in a contact arrangement by irradiation with actinic light, for example parallel light from a 200 watt mercury high-pressure lamp, through a quartz lens of focal length $f=15$ cm and through a blue glass filter with a maximum transmission of 75% of wavelength of 400 nm. For exposure, the recording material with the layer facing a glass plate, is fixed to the plate, forming a pocket, using adhesive tape at the edge. A register mark in the shape of a pair of straight lines at right angles is scribed beforehand into the recording layer outside what will subsequently be the image area for later alignment. The particular color separations are inserted into the said pocket, and, specifically, with the layer side facing the photoresist layer. The alignment into register of the original and the recording material is effected in each case with a microscope under yellow safelight. The aligned original is likewise fixed on the glass plate with adhesive tape, at a projecting end. To produce the color separation originals, a high-resolution silver film is exposed first in contact under a metal grating, which is located on a glass plate, and subsequently under a film negative of the corresponding color separation. The film negative has an alignment mark outside the image area. Production of the color separation originals for the contact exposure requires particular care in order to obtain transparent areas which are glass-clear and non-transparent areas which cover as much as possible without any blemishes. The specified exposure times are determined by measurement of the light intensity in preliminary experiments. After development with aqueous alkaline developer the sample is irradiated with white xenon light. A colored image of yellow, magenta and cyan is formed in the light passing through undiffracted, behind a projection optical element.

Under certain circumstances, the colored image shows interference patterns in the areas of color. In order to suppress this interference a drop of water of low surface tension is introduced into the contact gap between the post-hardened silver-film originals and the photoresist. The required exposure times are thereby reduced almost in half. Before developing, the exposed original copy is carefully rinsed with water and drops adhering to it are removed by dabbing it. A thin copper layer is vapor-deposited on the photoresist layer which carries the relief image containing all the color part-images, and a deposit of nickel is electroplated on the copper to form a matrix.

A polyvinyl chloride film is embossed in a press, at approximately 130° C., with the nickel matrix obtained. The relief image, formed in the polyvinyl chloride film by a single embossing operation, produces a colored image in yellow, magenta and cyan on projection in an undiffracted beam path.

EXAMPLE 5

Example 4 is repeated, using four color separation originals; the fourth color separation original corresponding to the black image areas in the colored original copy image. The white image areas are opaque at the relevant positions in all the color separations. Depending on the desired method of exposure, only the black positions are transparent on the black color separation and are provided with an irradiated, crossed double grating. The exposure time under the black color separation is 35 seconds. A projection image with yellow, magenta, cyan, white and black image parts is obtained, in undiffracted light, from the finished relief image produced by a single embossing.

The original copy or the information carrier, which contains, for example, an image, data or the like, can, within the scope of the invention, be any transparent material which can be embossed, even materials composed of layers. This material can consist of a non-embossable, rigid or flexible, carrier layer with an embossable cover layer. The lowering of the viscosity, required for embossing, must not necessarily be effected only by an increase of temperature, but can also be produced by the transitory action of solvents. A relief image is normally viewed in the air. Under certain conditions, when necessary, the image can be coated in order to protect it from the surrounding environment. In order to provide, in spite of the coating, the same optical conditions as with a non-coated relief image, the refractive index of the coating material must be taken into account. For this purpose it is necessary to specify the optical path length nd, where n is the refractive index and d the irradiated layer thickness. The difference between the optical path lengths at the relief grating should be chosen according to $d(n_1 - n_2)$, where d is the relief depth, $n_1$ is the refractive index of the relief material and $n_2$ is the refractive index of the coating material. Organic materials generally have refractive indices of about 1.5.

The information on the original copy is stored in areas on the film in the form of alphanumeric symbols, lines or areas with gratings of uniform grating depth, so-called relief structures, and the grating-like information structures in turn can in the conventional manner, be screened, for example to represent mixed colors. The areas can have connected information-structures as well as individual screen elements.

With screened images, the production of the color separation originals, as well as the alignment work is by its nature, particularly difficult.

The known screened structures have screen elements of about 10 μm diameter. Such screen elements can be represented, for example, by a ten-fold reduction of the 120 screen, customary in the printing industry, with 120 screen elements/cm. Mounting is effected in this case with the aid of register pins and holes up to accuracies of 1/200 mm. An effect which is observed particularly with screened information structures and which makes reproduction in color more difficult, is a color shading which occurs at the edge of the screen point and which is caused by a corresponding fall in the optical density of the photographic original at the edge of the screen point. Re-copying the original onto high-contrast silver film produces only a limited improvement. Relatively speaking, the best edge sharpness is obtained with metal images which are produced, for example, by coating a polyester film with an optically very dense aluminum layer having an optical density of far above three, with a layer of positive photoresist having an approximate thickness of 1 micron, followed by exposure under the screened original, and then development. The aluminum is etched away at the exposed portions with aqueous iron-III chloride solution and then the remaining photoresist layer is dissolved away.

Figure 2B:
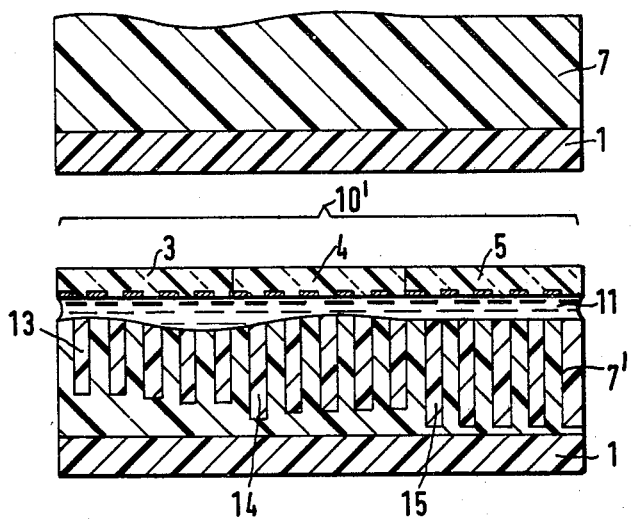

An identity carrier produced by embossing a deformable, transparent material with the matrix is identical to the original copy if, in the embodiments of the original copy represented by drawing according to FIGS. 1d and 2b, a structured material, such as, for example, an embossed polyvinyl chloride film, is employed in place of the structured photoresist layer 2', 7'.

Although the invention has been described with respect to particular recording materials, it should be understood that any of the conventional recording materials containing for example layers of negative-working photoresists with azido compositions or polyvinyl cinnamate compositions may be used. Normal such recording materials have not the same excellent edge sharpness as positive-working photoresists.

Likewise a wide range of deformable materials may be used to form copies of the original information carrier. Thus, many materials which are deformable and may be embossed under known methods, such as heat and pressure may be used. By way of example, some of these materials are: polyolefines such as polyethylene or non-stretched polyester.

The invention has been defined with reference to particular materials, layer thicknesses, light sources and the like. It should be understood however that the invention is not limited to only the materials used, but extends to all equivalents and substitutes which may be used and that the scope of the invention is limited only by the claims.

What is claimed is:

1. A process for producing an original of an information carrier for use in zero order diffraction color projection which comprises the steps of:
    (a) exposing a recording layer, mounted on a carrier, through separate color separation originals to form relief part-images, each relief part-image corresponding to a different projection color, said originals being transparent in the areas of the particular projection colors of the individual color separation originals each of said relief part-images of the projection color adjoining one another without overlap and having a depth corresponding to one of the particular projection colors;
    (b) exposing the entire portion of said recording layer to be utilized in carrying information to a grating pattern without intervening development to provide a structure in which the recording layer is exposed through to said carrier;

(c) said image-wise exposure through each individual color separation original provided with an energy density equal to that required to obtain the individual projection color; and (d) developing said exposed recording layer.

2. The process as defined by claim 1, wherein said exposure of step (a) is carried out through the individual color separation originals for different lengths of time.

3. The process as defined by claim 1, wherein said exposure of step (a) occurs before said exposure of step (b).

4. The process as defined by claim 1, which comprises photochemically degrading said recording layer during the exposure steps.

5. The process as defined by claim 4, wherein after the exposure of said recording layer during step (a), the recording layer is exposed over its entire surface down through to said carrier material with a grating pattern.

6. The process as defined by claim 1, wherein said exposure of step (b) is performed prior to said exposure of step (a).

7. The process as defined by claim 1, wherein steps (a) and (b) are combined for simultaneously exposing said recording layer to said color separation originals and said grating pattern.

8. The process as defined in claim 7, which comprises selecting the transmission parameters of said color separation original to correspond to preselected relief depths.

9. The process as defined by claim 1 or 7, which comprises carrying said grating exposure by passing laser beams having a line spacing corresponding to a grating pattern over said recording layer so that they interfere with one another; and modulating said laser beams to transmit information to said recording layer.

10. The process as defined by claim 1, which comprises forming said grating pattern of step (b) by modulating a light beam from a light source by means of gratings located in the path of said beam.

11. The process as defined by claim 1, wherein said grating exposure is obtained by means of color separation originals having a grating pattern which is copied thereon.

12. The process as defined by claim 1, which comprises arranging said color separation originals such that they contact said recording layer while said recording layer is being exposed.

13. The process as defined by claim 1, which comprises introducing a colorless contact liquid into a contact zone located between said recording layer and said color separation originals.

14. The process as defined by claim 1, which comprises using metal images as said separation originals.

15. The process as defined by claim 1, which comprises developing said recording layer under aqueous alkaline conditions.

* * * * *